(12) United States Patent
Ozawa et al.

(10) Patent No.: US 7,566,230 B2
(45) Date of Patent: Jul. 28, 2009

(54) ELECTRIC DISTRIBUTION BLOCK AND METHOD OF ASSEMBLING THE SAME

(75) Inventors: Keisuke Ozawa, Ogasa-gun (JP); Katsuhiro Kubota, Ogasa-gun (JP); Yukihiro Kawamura, Ogasa-gun (JP); Akinori Nakashima, Ogasa-gun (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/315,198

(22) Filed: Dec. 23, 2005

(65) Prior Publication Data

US 2006/0141822 A1  Jun. 29, 2006

(30) Foreign Application Priority Data

Dec. 24, 2004  (JP) .............................. 2004-374698

(51) Int. Cl.
*H01R 12/00* (2006.01)
(52) U.S. Cl. ..................................... 439/76.2
(58) Field of Classification Search ................ 439/76.1, 439/76.2
See application file for complete search history.

(56) References Cited

U.S. PATENT DOCUMENTS

| | | | |
|---|---|---|---|
| 5,509,812 A | 4/1996 | Comerci et al. | |
| 5,785,532 A | 7/1998 | Maue et al. | |
| 6,116,916 A * | 9/2000 | Kasai | 439/76.2 |
| 6,220,876 B1 | 4/2001 | Avila et al. | |
| 6,283,769 B1 * | 9/2001 | Asao et al. | 439/76.2 |
| 6,524,117 B1 | 2/2003 | Murakami et al. | |
| 6,926,541 B2 * | 8/2005 | Takeuchi et al. | 439/76.2 |
| 6,984,133 B2 * | 1/2006 | Naitou et al. | 439/76.2 |
| 7,193,841 B2 * | 3/2007 | Kita | 361/641 |
| 2002/0168882 A1 * | 11/2002 | Chiriku et al. | 439/76.2 |
| 2004/0043646 A1 * | 3/2004 | Takeuchi et al. | 439/76.2 |
| 2006/0141824 A1 * | 6/2006 | Kubota et al. | 439/76.2 |

FOREIGN PATENT DOCUMENTS

| | | |
|---|---|---|
| DE | 103 51 392 A1 | 5/2004 |
| JP | 08-251759 A | 9/1996 |
| JP | 11-027829 A | 1/1999 |
| JP | 2000-092659 A | 4/2000 |
| JP | 2000-114739 A | 4/2000 |
| JP | 2000-173682 A | 5/2000 |
| JP | 2002-027634 A | 1/2002 |
| JP | 2003-087938 A | 3/2003 |

OTHER PUBLICATIONS

EP Search Report dated Dec. 21, 2006 issued in Application No. 05 028 204.5.
Chinese Office Action dated Mar. 7, 2008.
English Language Translation of an Office Action in the Corresponding Japanese Application.

* cited by examiner

*Primary Examiner*—Tho D Ta
(74) *Attorney, Agent, or Firm*—Sughrue Mion, PLLC

(57) ABSTRACT

An electric distribution block includes a printed circuit board that has a distribution installation circuit, a block that has a plurality of terminals and is attached to the printed circuit board, and a power bus bar that has a rigid structure. The printed circuit board on which the block is attached is fixed to the power bus bar.

7 Claims, 14 Drawing Sheets

ELECTRIC DISTRIBUTION BLOCK AND METHOD OF ASSEMBLING THE SAME

BACKGROUND OF THE INVENTION

This invention relates to an electric distribution block for connecting and distributing a power circuit collectively to a load circuit such as a controller and a method of assembling the same.

A related electric distribution block includes an upper cover, an intermediate cover and a lower cover which jointly form a receiving space within which electrical parts are received (see, for example, JP-A-11-027829 (Page 3, FIG. 2)).

As shown in FIG. 14, the electric distribution block 100, disclosed in JP-A-11-027829, includes the upper cover 101, the intermediate cover 102 and the lower cover 103 (each of which is made of a synthetic resin) which jointly form a box-like connection box within which a wiring board 104, a bus bar circuit board 105, a printed circuit board 106, connectors 107 and 108, a fuse mounting portion 109 and a relay mounting portion 110 are received.

The wiring board 104 includes an insulating board, and a plurality of wires 111 are installed on this insulating board, and are connected to press-contacting portions formed respectively at one ends of L-shaped terminals 112. Tab-like contact portions, formed respectively at the other ends of the L-shaped terminals 112, project into the interior of a connector housing to form the connector 107.

The bus bar circuit 105 includes an insulating board on which a plurality of bus bars 113 are installed, and terminal portions of the bus bars 113 are disposed within the fuse mounting portion 109. The printed circuit board 106 includes an insulating board having printed circuits of predetermined shapes formed thereon. The printed circuit board 106 and the wiring board 104 are connected together by long terminals 114. L-shaped terminals 115, connected to the printed circuit board 106, project into the interior of the connector 108. The connectors 107 and 108 and the fuse mounting portion 109 project outwardly from the intermediate cover 102. The printed circuit board 106 is fired to the intermediate cover 102 and the lower cover 103 by a mounting plate 116 and screws 117.

In the electric distribution block in JP-A-11-027829, however, cumbersome joining technique (such as soldering) is required for installing the wires 111 on the wiring board 104 and for electrically connecting the circuit boards 105 and 106, the connectors 107 and 108, the fuse mounting portion 109, the relay mounting portion 110 and so on to one anther so as to form circuits. Therefore, the efficiency of the operation is not good, and this has invited a problem that the time and labor required for the assembling operation, as well as the cost of the assembling operation, can not be reduced. And besides, at the time when the wires 111 are soldered, the wires 111 are displaced, so that cracks are liable to develop in the soldered portions, and therefore there has been a fear that the incomplete electrical connections occur.

SUMMARY OF THE INVENTION

This invention has been made in view of the above circumstances, and an object of the invention is to provide an electric distribution block in which the time and labor, required for an assembling operation, can be reduced, and also the assembling operation can be effected positively and a method of assembling the electric distribution block.

1) An electric distribution block of the present invention is characterized in that the electric distribution block includes a printed circuit board having a distribution installation circuit formed thereon, a power bus bar, a plurality of blocks each having a plurality of terminals press-fitted therein; and the printed circuit board on which the blocks are mounted is fixed to the power bus bar having a rigid structure.

2) The electric distribution block of the invention, recited in the above Paragraph 1), is characterized in that the plurality of blocks are a fuse holder which has a plurality of fuse terminals and a power supply terminal press-fitted therein, and also has a fuse plate mounted thereon in the vicinity of the terminals, and a plurality of connector blocks each having a plurality of connection terminals press-fitted therein.

3) The electric distribution block of the invention, recited in the above Paragraph 1), is characterized in that the power bus bar is formed by insert molding.

4) The electric distribution block of the invention, recited in the above Paragraph 2) or Paragraph 3), is characterized in that after the printed circuit board is fixed to the power bus bar having the rigid structure, the connection terminals of the fuse holder and the connection terminals of the connector blocks are soldered at a reverse surface of the printed circuit board.

In the invention recited in the above Paragraphs 1) to 4), the fuse holder and the plurality of connector blocks are mounted on the printed circuit board, and then the printed circuit board is fixed to the power bus bar having the rigid structure, and then the fuse terminals and power supply terminal of the fuse holder and the connection terminals of the connector blocks are soldered at the reverse surface of the printed circuit board to be electrically connected thereto. Therefore, when the printed circuit board, having the fuse holder and the plurality of connector blocks mounted thereon, is fixed to the power bus bar, there is provided the assembly of high rigidity. Then, the fuse terminals and power supply terminal of the fuse holder and the connection terminals of the connector blocks are soldered to the printed circuit board, and therefore these terminals are soldered to the assembly of high rigidity, so that the efficiency of the operation is good, and the time and labor, required for the assembling operation, can be reduced. Thus, the assembly has the high rigidity, and therefore the displacement of the parts will not occur during and after the soldering operation, and cracks will not develop in the soldered portions, and therefore the assembling operation can be carried out positively.

5) The electric distribution block of the invention, recited in the above Paragraph 2) or Paragraph 4), is characterized in that when one of the fuse holder and each connector block is fixed onto the printed circuit board, the other is provisionally fixed to the printed circuit board.

In the invention recited in the above Paragraph 5), the connection terminals of the connector blocks or the fuse terminals and power supply terminal of the fuse holder are soldered to the printed circuit board to which the connector blocks or the fuse holder are provisionally fixed, and therefore the displacement of the parts is further prevented.

6) The electric distribution block of the invention, recited in any one of the above Paragraphs 2 to 5, is characterized in that simultaneously when the power bus bar is fixed, the provisionally-fixed connector blocks or the provisionally-fixed fuse holder are fixed by a fixing portion provided on the power bus bar.

In the invention recited in the above Paragraph 6), when the power bus bar is fixed to the provisionally-fixed connector blocks or the provisionally-fixed fuse holder, the connector blocks or the fuse holder are fixed to the power bus bar by the fixing portion. With this construction, this fixing operation can be carried out, efficiently utilizing a space without the use of any other separate fixing portion.

7) The electric distribution block of the invention, recited in the above Paragraph 6), is characterized in that the fixing portion are generally T-shaped projections.

In the invention of the above Paragraph 7), the T-shaped projections are used, and therefore the fuse holder and the plurality of connector blocks can be mounted on the printed circuit board in such a manner that they will not be displaced and shake.

The electric distribution block of the present invention can solve problems that the efficiency of the operation is not good, that the time and labor, required for the assembling operation, can not be reduced and that cracks develop in the soldered portions, thereby inviting incomplete electrical connections. Therefore, there are achieved advantages that the time and labor, required for the assembling operation, can be reduced and that the assembling operation can be carried out positively.

According to the present invention, there is also provided a method of assembling an electric distribution block, comprising:

attaching a block having a plurality of terminals to a printed circuit board having a distribution installation circuit; and fixing a power bus bar having a rigid structure to the printed circuit board on which the block is attached.

Preferably, a plurality of the blocks are a fuse holder and a connector block. A plurality of fuse terminals and a power supply terminals are press-fitted in the fuse holder, and a fuse plate arranged in the vicinity of the terminals is attached to the fuse holder. A plurality of connection terminals are press-fitted in the connector block.

Preferably, The power bus bar is formed by insert molding.

Preferably, the method further comprising a process of soldering the block to the printed circuit board after the fixing process is carried out.

Preferably, when one of the fuse holder and the connector block is fixed to the printed circuit board, the other of the fuse holder and the connector block is provisionally fixed to the printed circuit board.

Preferably, the power bus bar has a fixing portion. Simultaneously when the power bus bar is fixed to the printed circuit board, the provisionally-fixed connector block or the provisionally-fixed fuse holder is fixed by the fixing portion.

Preferably, the fixing portion is T-shaped projection.

According to the present invention, there is also provided an electric distribution block, comprising:

a printed circuit board that has a distribution installation circuit;

a block that has a plurality of terminals and is attached to the printed circuit board; and a power bus bar that has a rigid structure, wherein the printed circuit board on which the block is attached is fixed to the power bus bar.

Preferably, a plurality of the blocks are a fuse holder and a connector block. A plurality of fuse terminals and a power supply terminals are press-fitted in the fuse holder, and a fuse plate arranged in the vicinity of the terminals is attached to the fuse holder. A plurality of connection terminals are press-fitted in the connector block.

Preferably, the block is soldered to the printed circuit board that is fixed to the power bus bar.

Preferably, the power bus bar has a fixing portion. The block is fixed to the power bus bar by the fixing portion.

Preferably, the fixing portion is T-shaped projection.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

A preferred embodiment of the present invention will now be described in detail with reference to the drawings.

Figure 1:
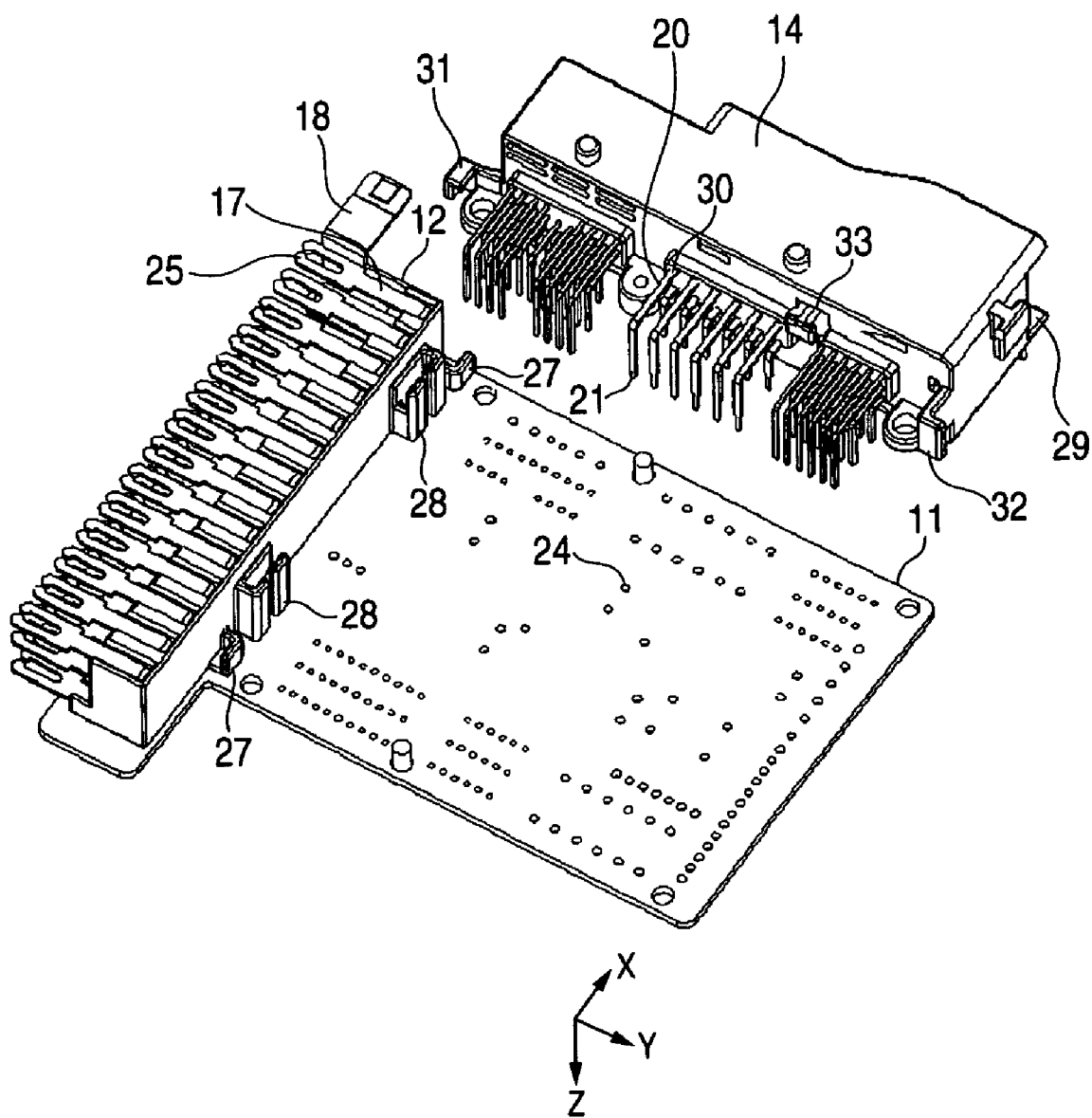
FIG. 1 is a perspective view explanatory of the mounting relation between a printed circuit board, a fuse holder and a connector block used in one preferred embodiment of an electric distribution block of the invention.
Figure 2:
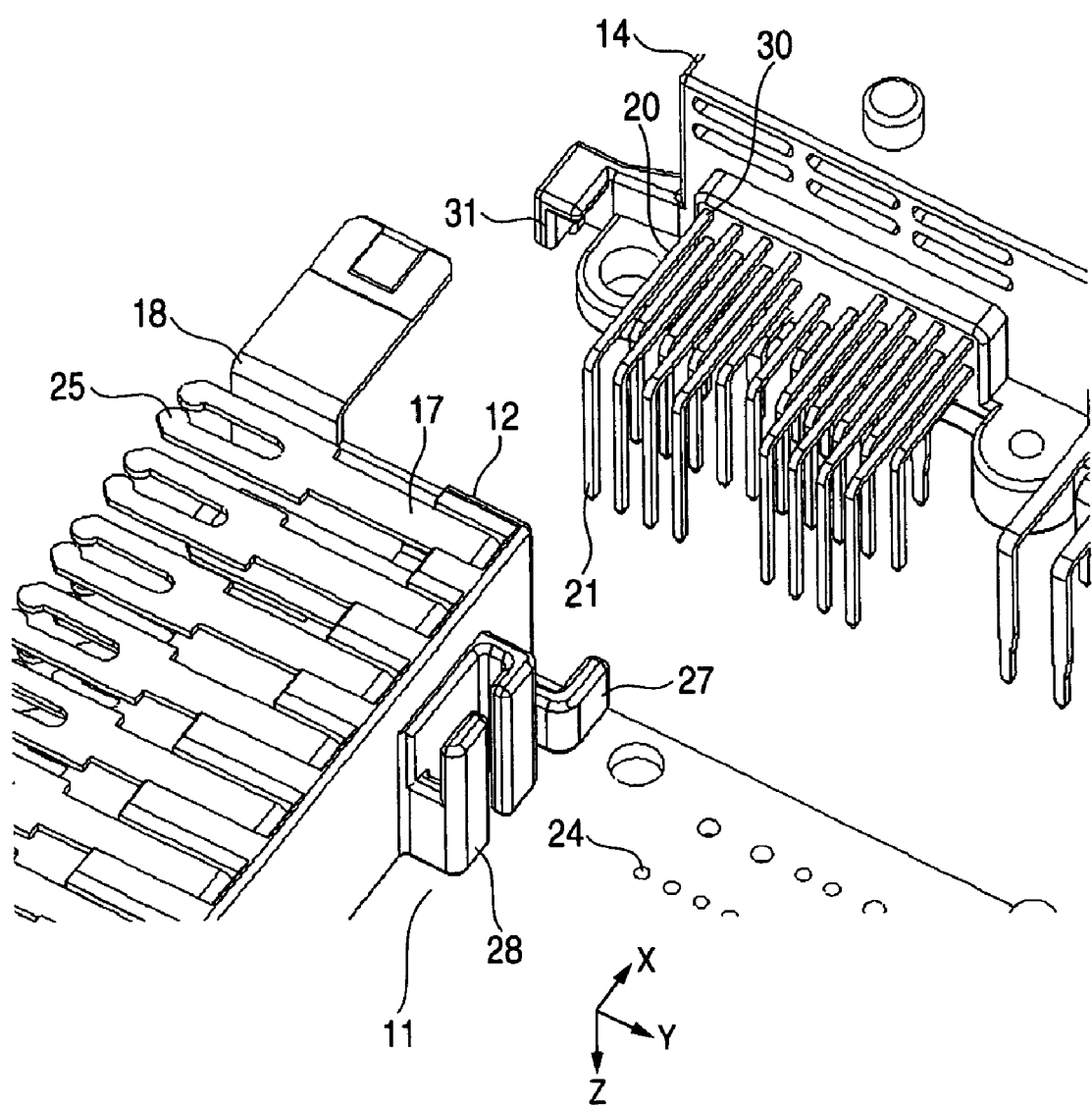
FIG. 2 is an enlarged view of an important portion of FIG. 1.
Figure 3:
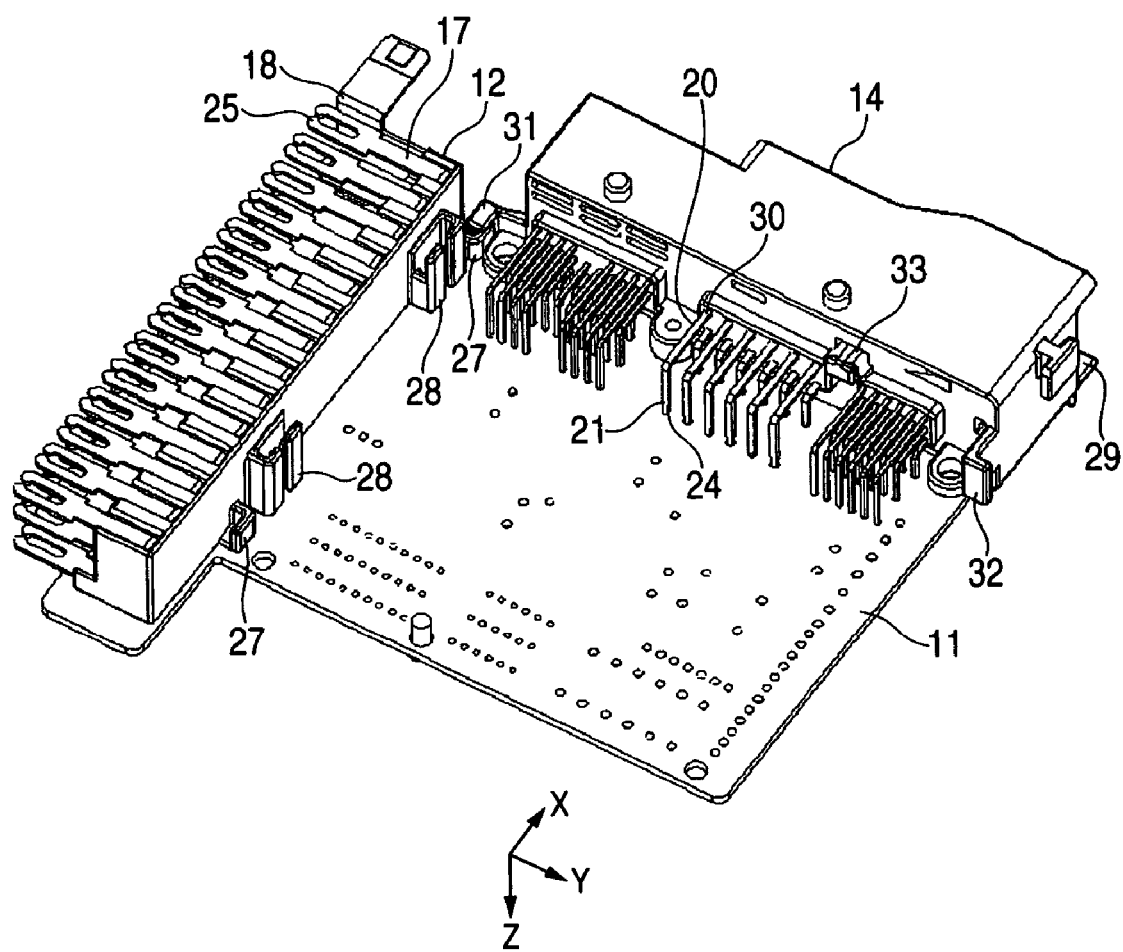
FIG. 3 is a perspective view showing a condition in which the fuse holder and the first connector block of FIG. 1 are provisionally fixed to each other.
Figure 4:
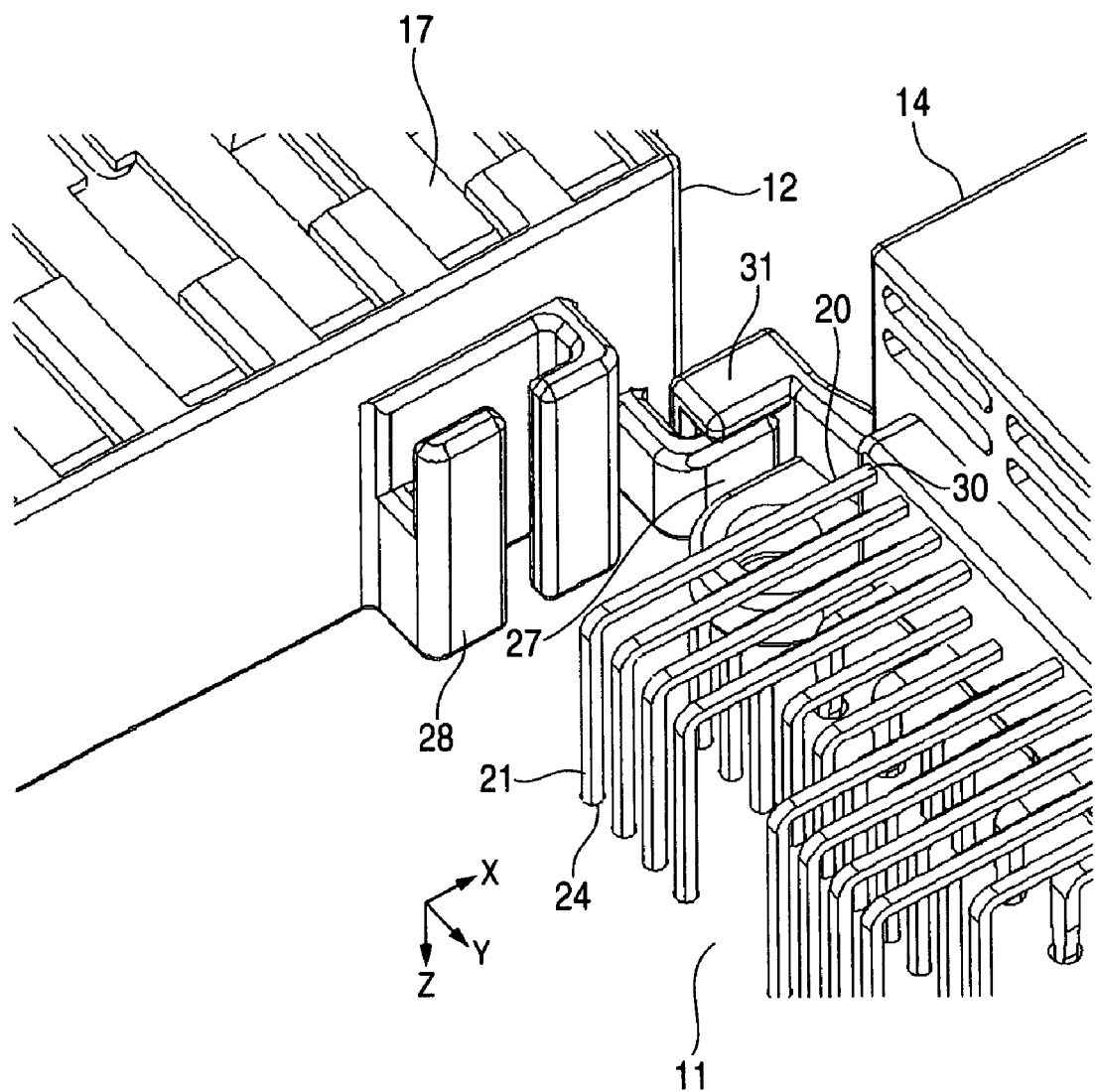
FIG. 4 is an enlarged view of an important portion of FIG. 3.
Figure 5:
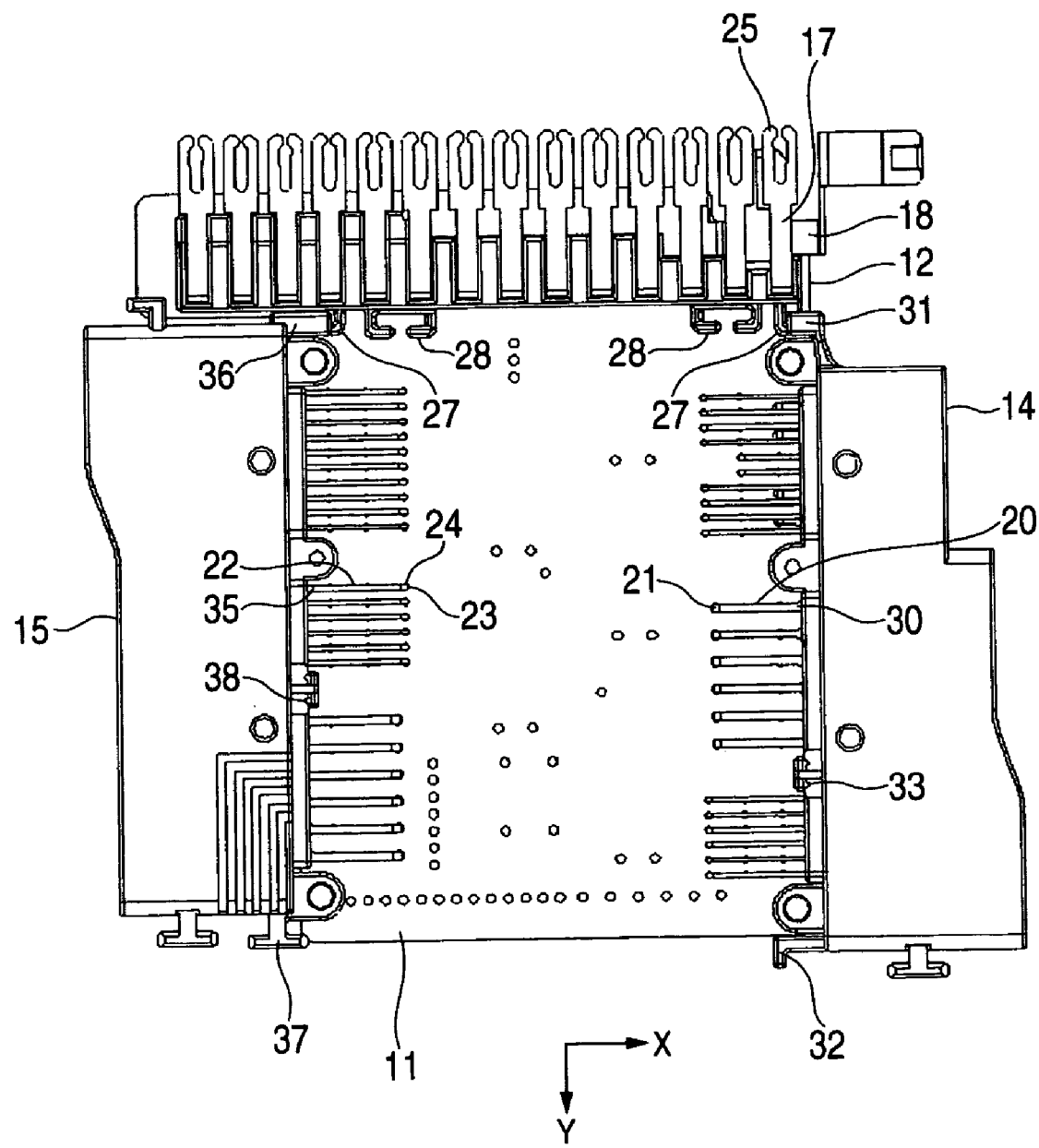
FIG. 5 is a perspective view explanatory of the mounting relation between the printed circuit board, the fuse holder and the first and second connector blocks used in the electric distribution block of the invention.

FIG. 1 is a perspective view explanatory of the mounting relation between a printed circuit board, a fuse holder and a connector block used in one preferred embodiment of an electric distribution block of the invention, FIG. 2 is an enlarged view of an important portion of FIG. 1, FIG. 3 is a perspective view showing a condition in which the fuse holder and the first connector block of FIG. 1 are provisionally fixed to each other, FIG. 4 is an enlarged view of an important portion of FIG. 3, and FIG. 5 is a perspective view explanatory of the mounting relation between the printed circuit board, the fuse holder and the first and second connector blocks used in the electric distribution block of the invention.

Figure 6:
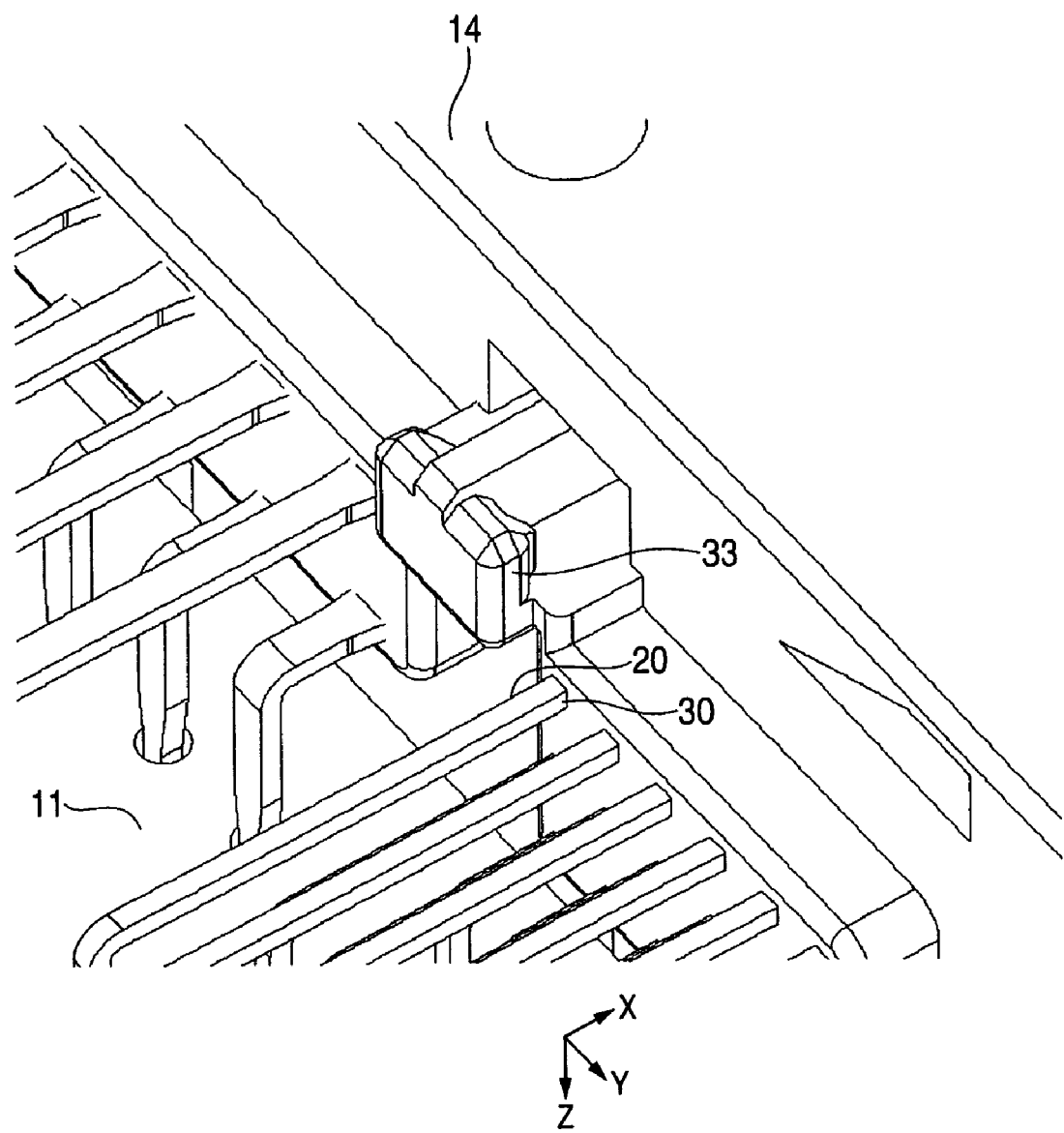
FIG. 6 is an enlarged view showing a fixing portion, provided at the connector block, and its vicinities.
Figure 7:
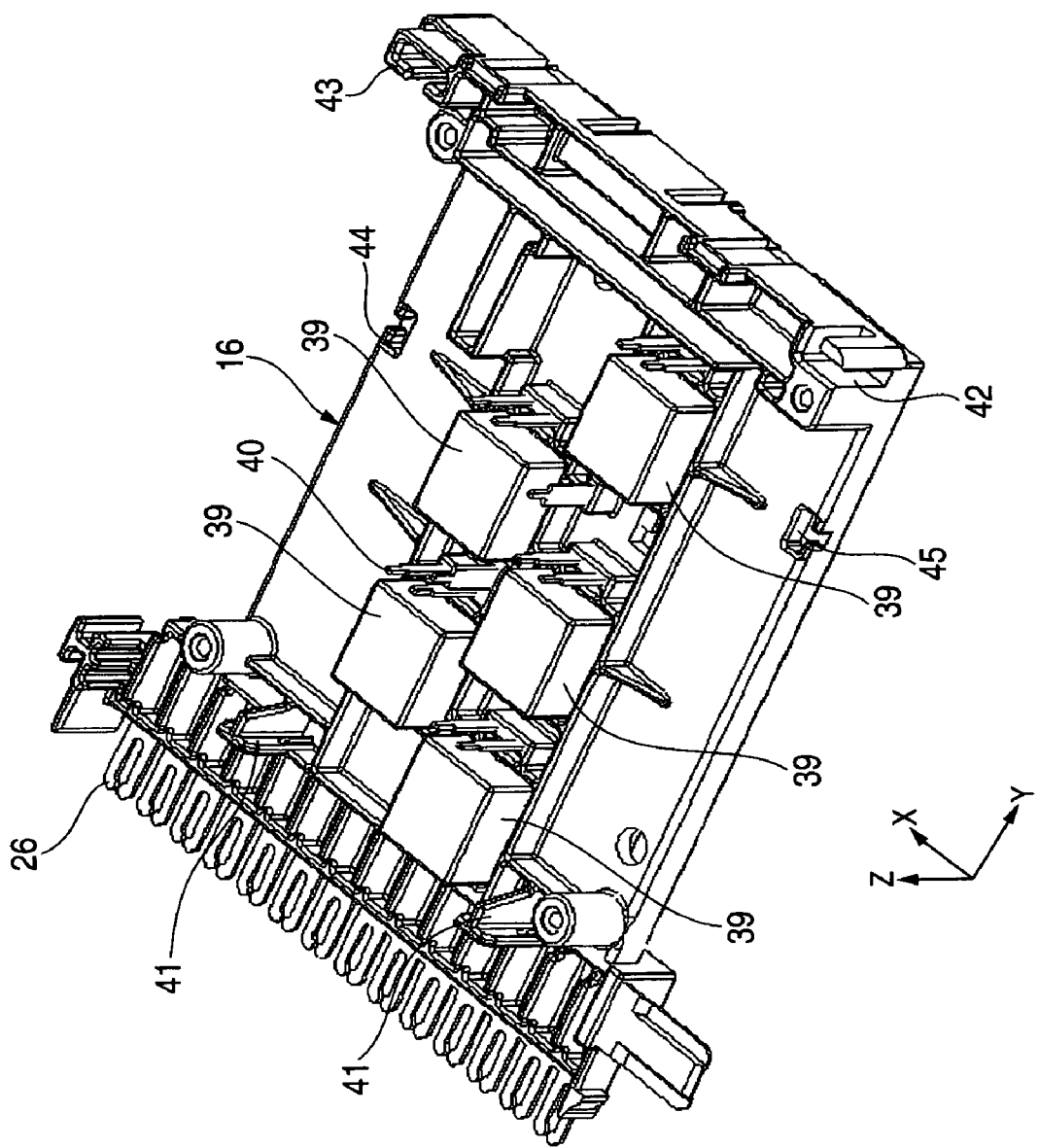
FIG. 7 is a perspective view showing a power bus bar, used in the electric distribution block of the invention, alone.
Figure 8:
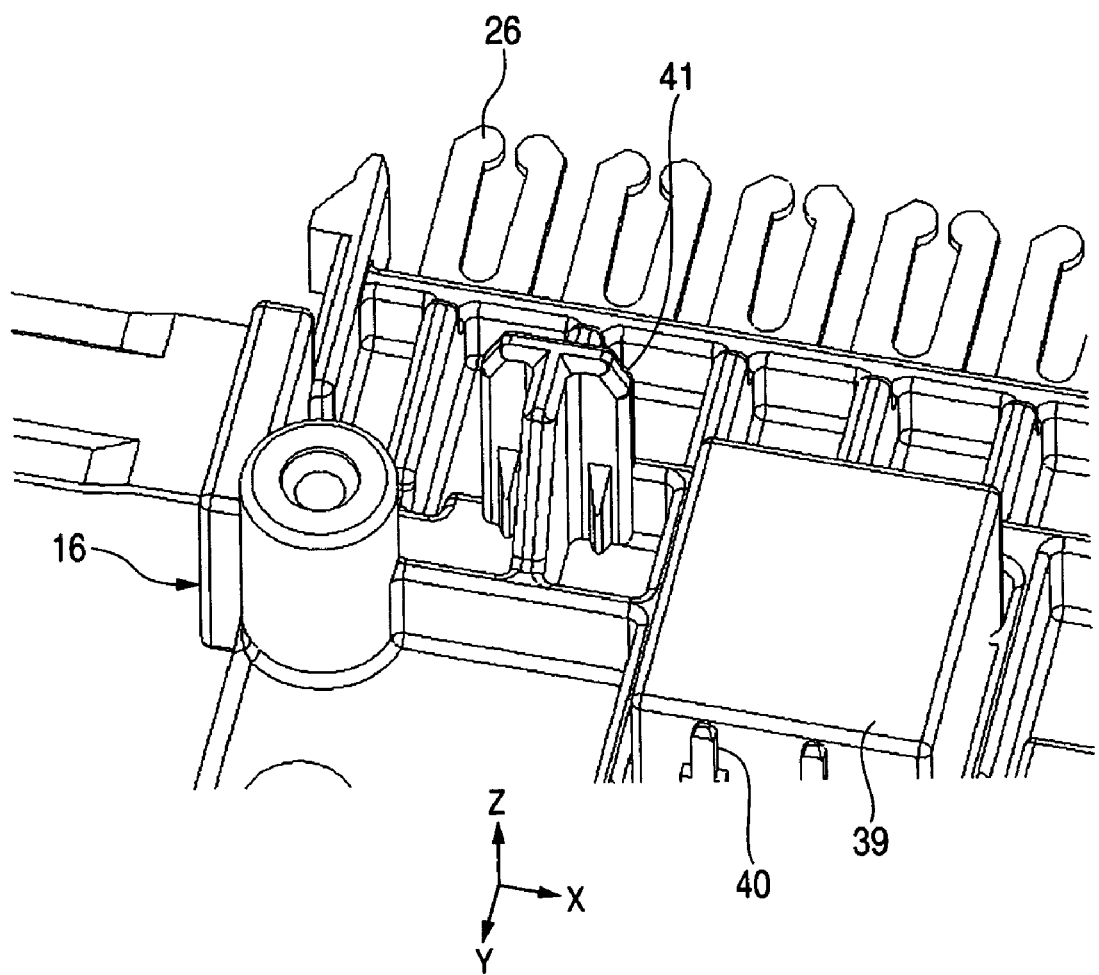
FIG. 8 is an enlarge view showing a fixing portion, provided at the power bus bar of FIG. 7, and its vicinities.
Figure 9:
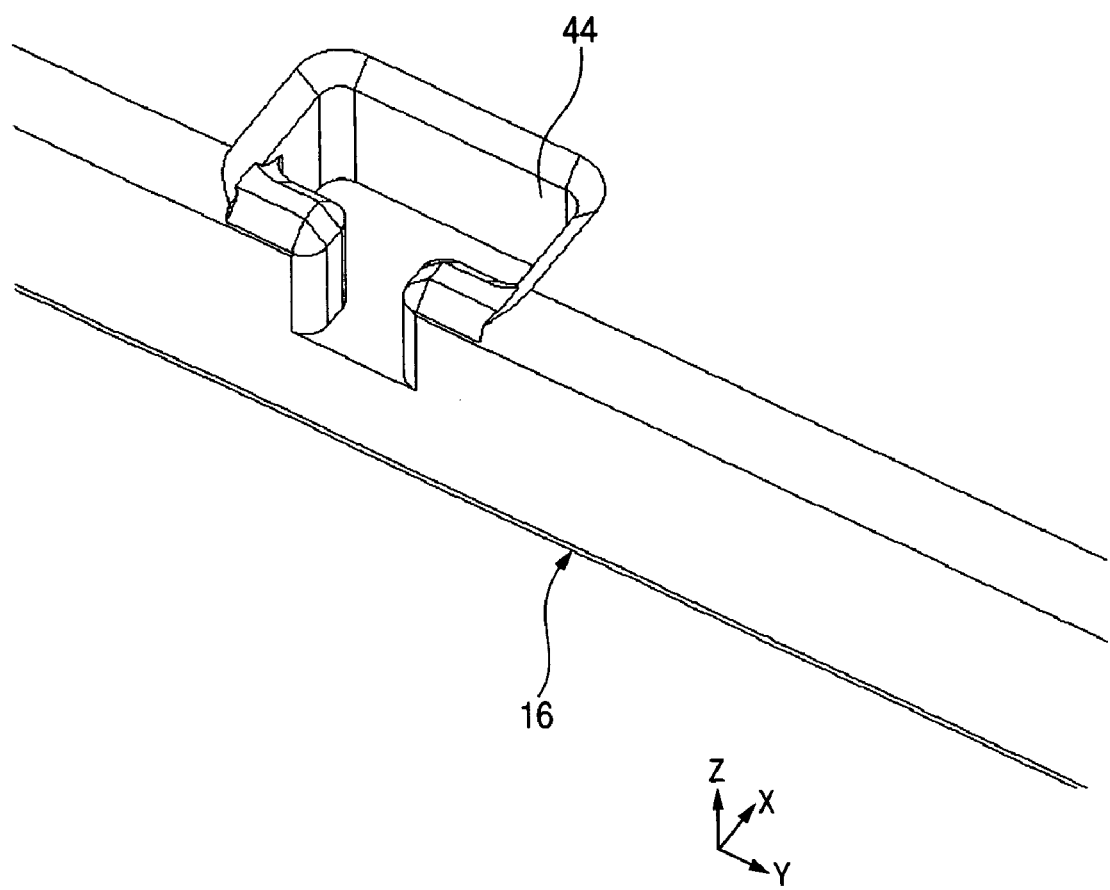
FIG. 9 is an enlarged view of a fixing portion, provided at the power bus bar of FIG. 7, and its vicinities.
Figure 10:
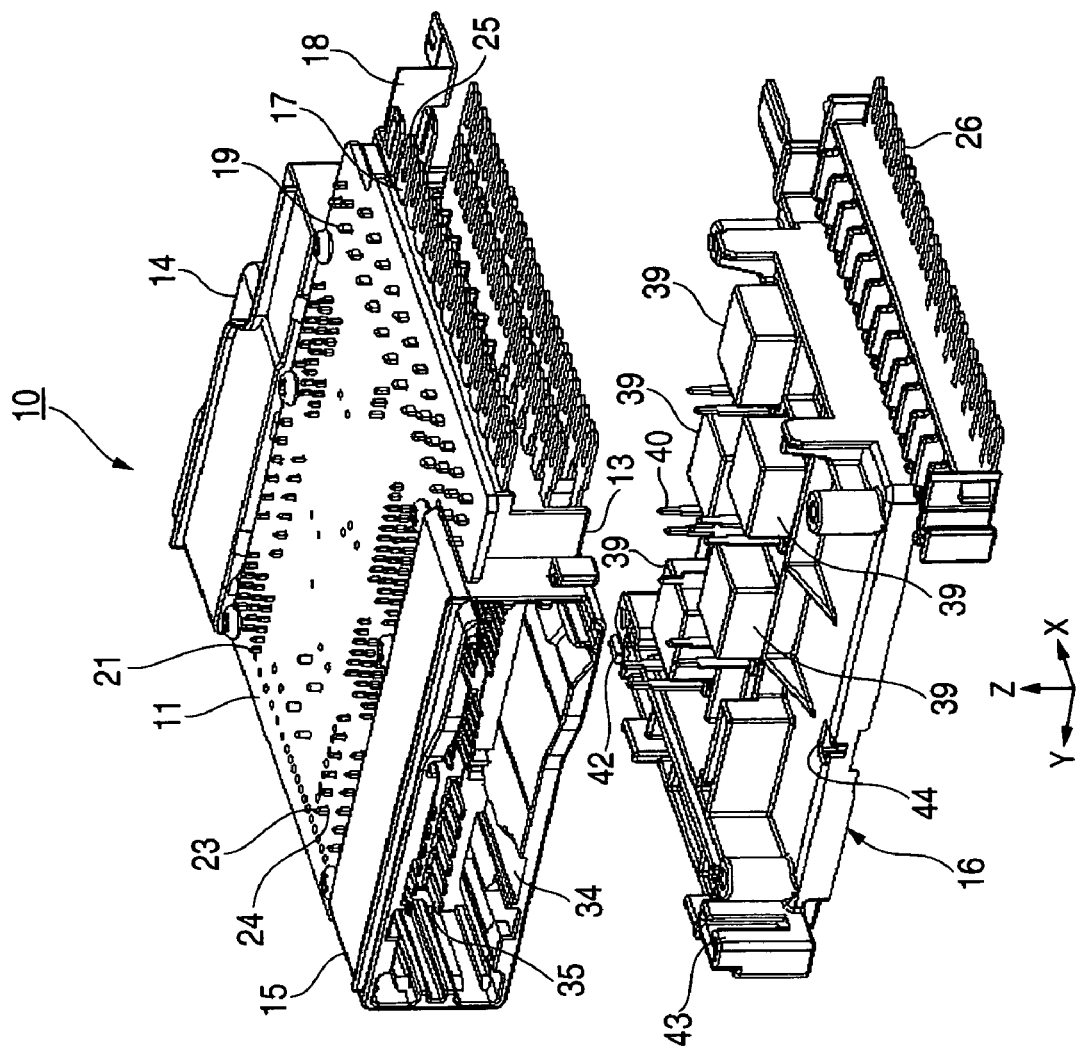
FIG. 10 is a perspective view of the electric distribution block of the invention which is in the process of being assembled.
Figure 11:
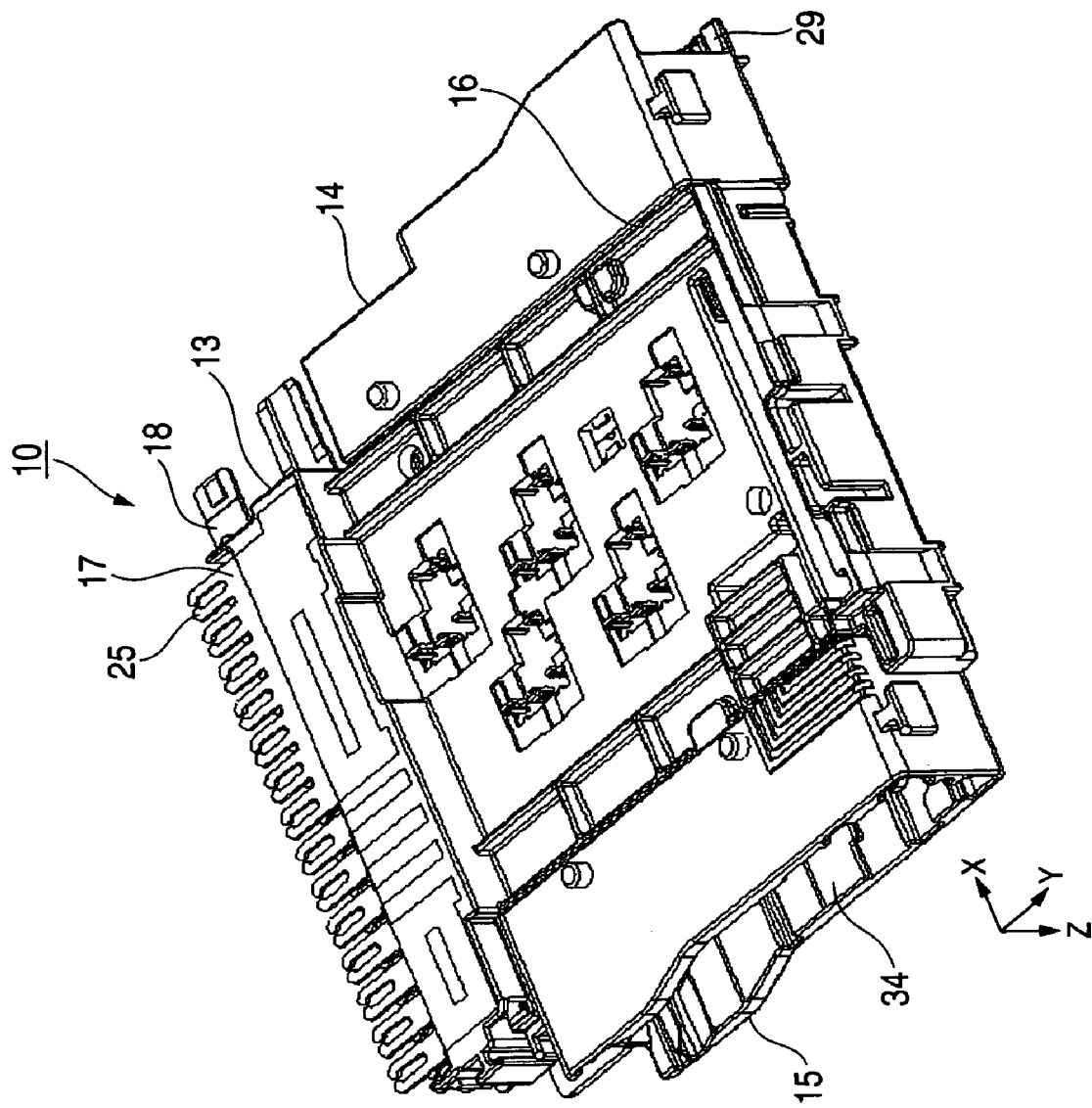
FIG. 11 is a perspective view of the electric distribution block of FIG. 10 in its assembled condition.
Figure 12:
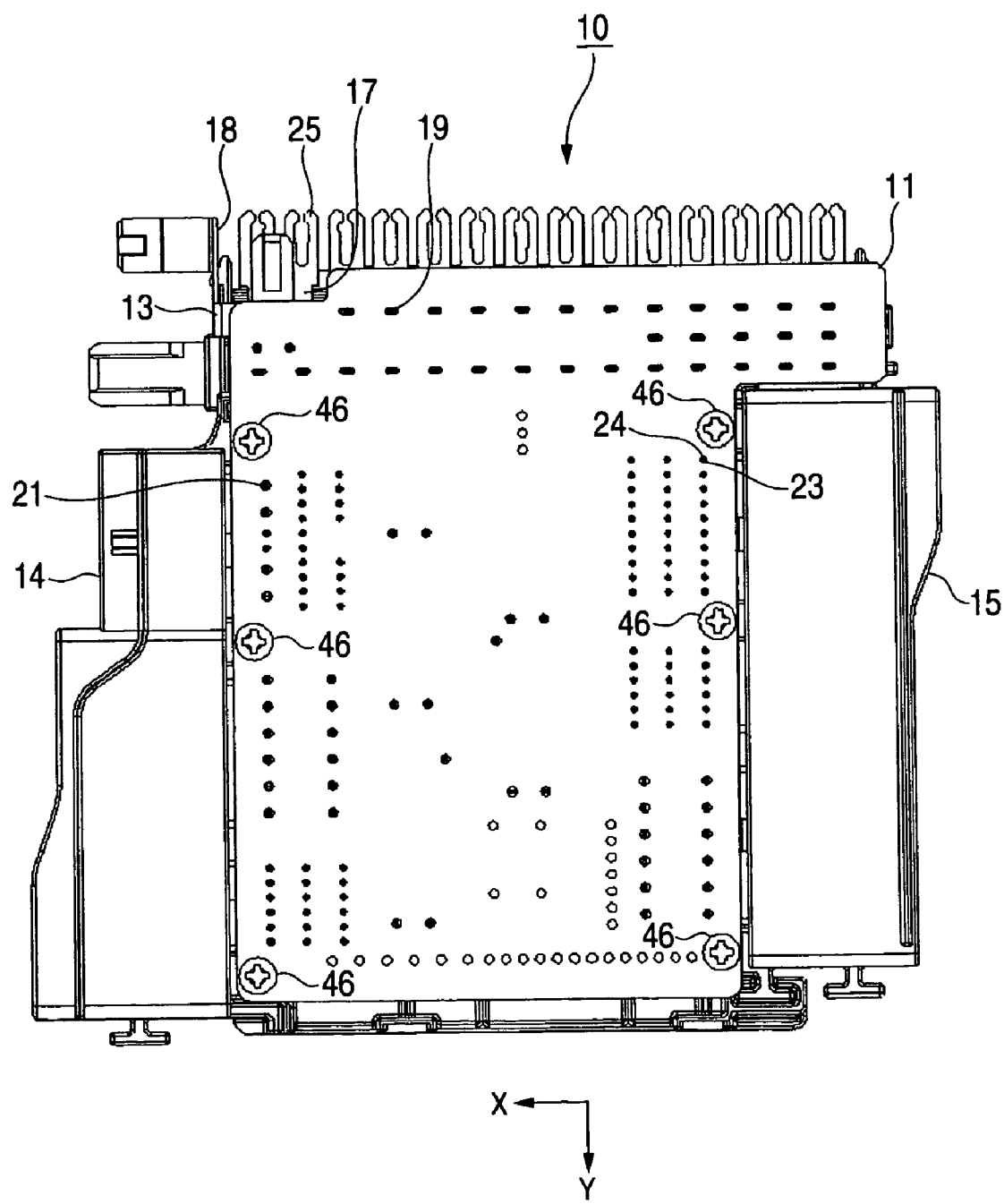
FIG. 12 is a plan view of the electric distribution block of FIG. 11.
Figure 13:
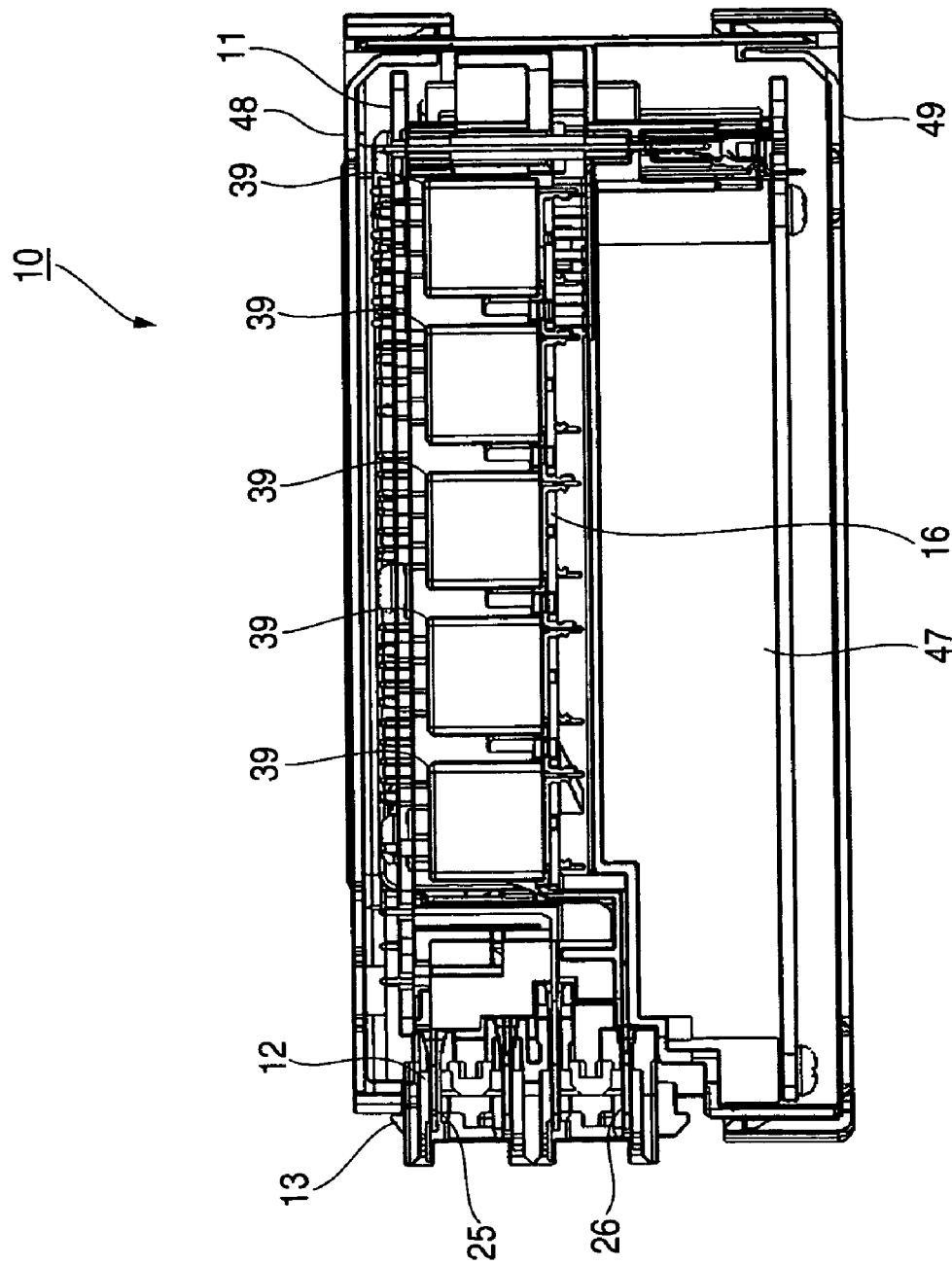
FIG. 13 is a cross-sectional view of the electric distribution block of FIG. 12.
Figure 14:
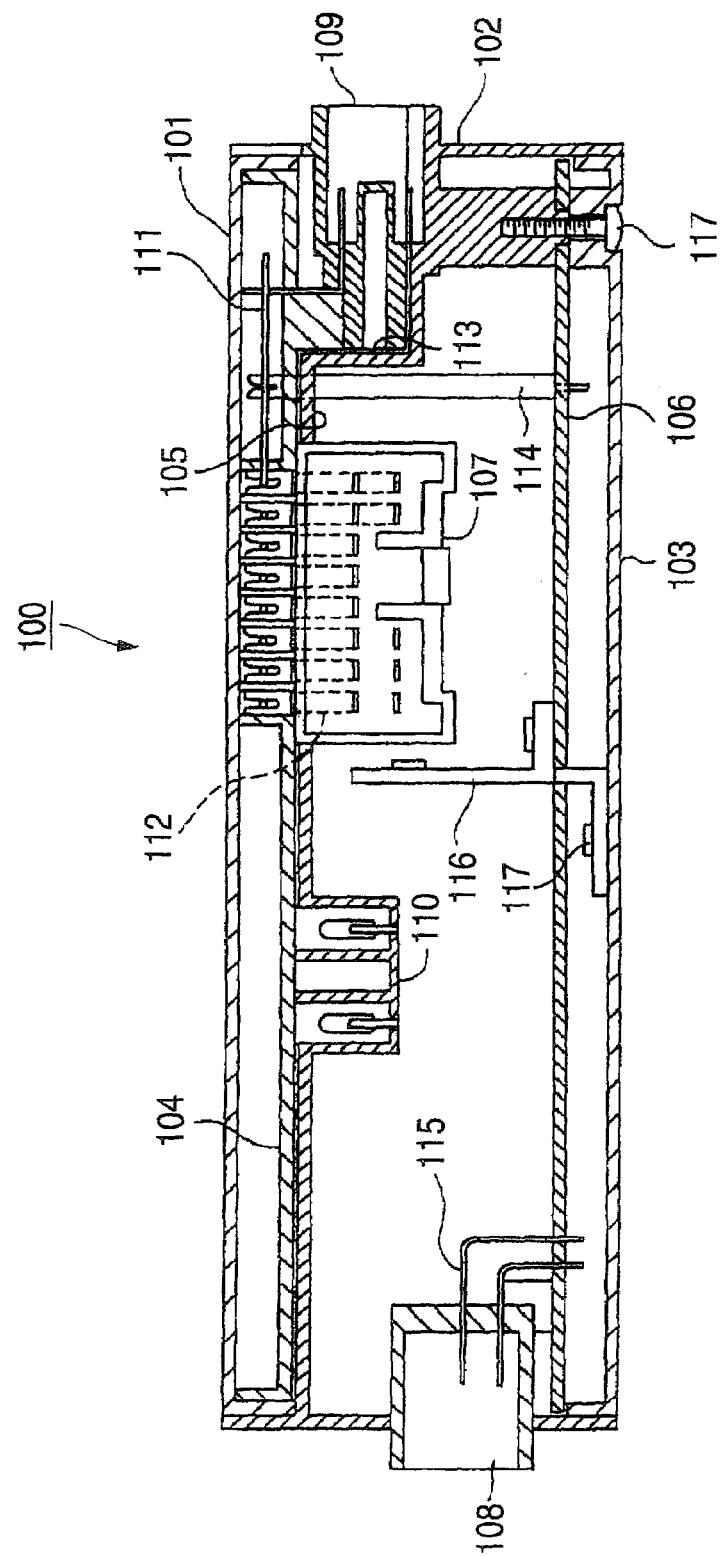
FIG. 14 is a cross-sectional view of a related electric distribution block.

FIG. 6 is an enlarged view showing a fixing portion, provided at the connector block, and its vicinities, FIG. 7 is a perspective view showing a power bus bar, used in the electric distribution block of the invention, alone, FIG. 8 is an enlarge view showing a fixing portion, provided at the power bus bar of FIG. 7, and its vicinities, FIG. 9 is an enlarged view of a fixing portion, provided at the power bus bar of FIG. 7, and its vicinities, FIG. 10 is a perspective view of the electric distribution block of the invention which is in the process of being assembled, FIG. 11 is a perspective view of the electric distribution block of FIG. 10 in its assembled condition, FIG. 12 is a plan view of the electric distribution block of FIG. 11, and FIG. 13 is a cross-sectional view of the electric distribution block of FIG. 12. With respect to coordinates X, Y, Z in the drawings, X denotes a right direction, Y denotes a rear direction, and Z denotes an upward direction.

As shown in FIG. 1, the preferred embodiment of the electric distribution block 10 of the invention includes the printed circuit board 11, the fuse holder 12 having a fuse plate 13 (see FIG. 13) mounted thereon, the first connector block 14, the second connector block 15 (see FIG. 5) and the power bus bar 16 (see FIG. 7) which are assembled together.

The printed circuit board 11 has a plurality of connection holes 24. Board connection portions 19 (see FIG. 10) formed respectively at one ends of a plurality of fuse terminals 17 (provided at the fuse holder 12) and one end of a power supply terminal 18 (provided at the fuse holder 12), board connection portions 21 formed respectively at one ends of a plurality of connector terminals 20 (press-fitted in the first connector block 14), and board connection portions 23 formed respectively at one ends of a plurality of connector terminals 22 (see FIG. 5) (which are press-fitted in the second connector block 15) are inserted respectively in the corresponding connection holes 24 so as to be electrically connected to a distribution installation circuit (not shown).

The fuse holder 12 is mounted on an end edge portion (directed in a direction opposite to the direction Y in FIG. 1) of the printed circuit board 11. The fuse terminals 17, provided in the fuse terminal 12, have bifurcated fuse insertion portions 25 formed respectively at the other ends thereof (projecting in the direction opposite to the direction Y (in FIG. 1)) and arranged in three rows in the upward-downward direction, each row having fourteen (14) fuse terminals 17. A plurality of auto-fuses (not shown) are electrically connected to the upper two rows (lower two rows in FIG. 1) of fuse terminals 17. The lowermost row (uppermost row in FIG. 1) of fuse terminals 17 (that is, the fuse insertion portions 25) are opposed respectively to a row of (fourteen) fuse insertion portions 26 (provided at the power bus bar 16) in the upward-downward direction, and a plurality of auto-fuses (not shown) are electrically connected to these opposed fuse insertion portions 25 and 26.

The fuse holder 12 has a pair of connector block fixing reception portions 27 and 27 of a generally L-shape (forming a fixing portion) formed on an end surface thereof facing in the direction X (in FIG. 1). A pair of bus bar fixing reception portions 28 and 28 (forming a fixing portion) of a generally. C-shape are formed on this end surface of the fuse holder 12, and are disposed between the pair of connector block fixing reception portions 27.

The first connector block 14 has a connector insertion portion 29 in the form of a generally rectangular hole, and is mounted on an end edge portion of the printed circuit board 11 directed in the direction X (in FIG. 1). Each of the connector terminals 20, provided at the first connector block 14, is an L-shaped terminal, and includes the board connection portion 21 extending in the direction Z (in FIG. 1), and an external connection portion 30 extending in the direction X (in FIG. 1). The external connection portions 30 project into the connector insertion portion 29, and are arranged in a predetermined pattern.

A fuse holder fixing engagement projection 31 of a generally L-shape (forming a fixing portion) is formed on an end surface of the first connector block 14 facing in the direction opposite to the direction X (in FIG. 1), and more specifically is formed on that portion of this end surface disposed close to the fuse holder 12. A bus bar fixing engagement projection 32 of a generally L-shape (forming a fixing portion) is formed on that portion of the end surface of the first connector block 14 disposed remote from the fuse holder 12, and a bus bar fixing engagement projection 33 of a generally T-shape (forming a fixing portion) is formed at a central portion of the end surface of the first connector block 14 facing in the direction opposite to the direction X (in FIG. 1).

As shown in FIG. 2, each of the connector block fixing reception portions 27 of the fuse holder 12 has the generally L-shape, and can be brought into engagement with the mating fixing portion in a direction opposite to the direction Z (in FIG. 1). Each of the bus bar fixing reception portions 28 of the fuse holder 12 has the generally C-shape, and can be brought into engagement with the mating fixing portion in the direction opposite to the direction Z (in FIG. 1).

As shown in FIG. 3, the fuse holder fixing engagement projection 31 of the first connector block 14 is engaged with the corresponding connector block fixing reception portion 27 of the fuse holder 12 mounted on the printed circuit board 11.

As shown in FIG. 4, when the first connector block 14 is to be attached to the printed circuit board 11, the fuse holder fixing engagement projection 31 is engaged with the connector block fixing reception portion 27 of the fuse holder 12 while the board connection portions 21 of the connector terminals 20 are inserted into the respective connection holes 24 in the printed circuit board 11. Therefore, by the insertion of the connector terminals 20 into the connection holes 24 in the printed circuit board 11 and also by the engagement of the fuse holder fixing engagement projection 31 with the connector block fixing reception portion 27, the first connector block 14 is provisionally fixed to the fuse holder 12 and the printed circuit board 11 against displacement relative thereto.

As shown in FIG. 5, the second connector block 15 has a connector insertion portion 34 (see FIG. 10) in the form of a generally rectangular hole, and is mounted on an end edge portion of the printed circuit board 11 directed in a direction opposite to the direction X (in FIG. 5). Each of the connector terminals 22, provided at the second connector block 15, is an L-shaped terminal, and includes the board connection portion 23 extending downward (in FIG. 5), and an external connection portion 35 extending in the direction opposite to the direction X (in FIG. 5). The external connection portions 35 project into the connector insertion portion 34, and are arranged in a predetermined pattern.

A fuse holder fixing engagement projection 36 of a generally L-shape (forming a fixing portion) is formed on an end surface of the second connector block 15 facing in the direction X (in FIG. 5), and more specifically is formed on that portion of this end surface disposed close to the fuse holder 12. A bus bar fixing engagement projection 37 (forming a fixing portion) of a generally T-shape is formed on that portion of the end surface of the second connector block 15 disposed remote from the fuse holder 12, and a bus bar fixing engagement projection 38 of a generally T-shape (forming a fixing portion) is formed at a central portion of the end surface of the second connector block 15 facing in the direction X (in FIG. 5).

Here, the board connection portions 19 of the fuse terminals 17 and power supply terminal 18, provided at the fuse holder 12, are inserted into the respective connection holes 24 in the printed circuit board 11, and the board connection portions 21 of the connector terminals 20, provided at the first connector block 14, are inserted into the respective connection holes 24 in the printed circuit board 11, and the fuse holder engagement projection 31 is engaged with the connector block fixing reception portion 27 of the fuse holder 12, and the board connection portions 23 of the connector terminals 22, provided at the second connector block 15, are inserted into the respective connection holes 24 in the printed circuit board 11, and the fuse holder engagement projection 36 is engaged with the connector block fixing reception portion 27 of the fuse holder 12. As a result, the first and second connector blocks 14 and 15 are provisionally fixed relative to the fuse holder 12 and the printed circuit board 11.

As shown in FIG. 6, the bus bar fixing engagement projection 33 (37, 38) is formed into the generally T-shape. Therefore, when the power bus bar 16 is attached, the bus bar fixing engagement projection is firmly engaged with the power bus bar 16 to hold the same against displacement.

As shown in FIG. 7, the power bus bar 16 has a plurality of plate-like bus bars (not shown) integrally insert-molded in its body, and has the fourteen (14) fuse insertion portions 26 extending in a direction opposite to the direction Y (in FIG. 7). Five relays 39 are arranged in two rows at a central portion of the power bus bars 16, and are fitted on the bus bars to be electrically connected thereto. Board connection portions 40, extending in the direction Z (in FIG. 7), are disposed between the adjacent relays 39. The plurality of bus bars are insert-molded in the body of the power bus bar 16, and therefore the power bus bar 16 has a high rigidity.

A pair of fuse holder engagement projections 41 and 41 of a generally T-shape (forming a fixing portion) for insertion respectively into the pair of C-shaped bus bar fixing reception portions 28 and 28 of the fuse holder 12 are formed at an end portion of the power bus bar 16 directed in a direction opposite to the direction Y (in FIG. 7). A connector block engagement reception portion 42 of a generally L-shape (forming a fixing portion) for receiving the L-shaped bus bar fixing engagement projection 32 of the first connector block 14 is formed at an end portion of the power bus bar 16 directed in the direction Y (in FIG. 7). A connector block engagement reception portion 43 of a generally C-shape (forming a fixing portion) for receiving the T-shaped bus bar fixing engagement projection 37 of the second connector block 15 is formed at the end portion of the power bus bar 16 directed in the direction Y (in FIG. 7).

A connector block engagement reception portion 44 of a generally C-shape (forming a fixing portion) for receiving the T-shaped bus bar fixing engagement projection 33 of the first connector block 14 is formed at an end edge portion of the power bus bar 16 directed in a direction opposite to the direction X (in FIG. 7). A connector block engagement reception portion 45 of a generally C-shape (forming a fixing portion) for receiving the T-shaped bus bar fixing engagement projection 38 of the second connector block 15 is formed at an end edge portion of the power bus bar 6 directed in the direction X (in FIG. 7).

As shown in FIG. 8, each of the fuse holder engagement projections 41 is in the form of a pillar of a T-shaped cross-section, and therefore even when the fuse holder engagement projection 41 undergoes stresses, acting in the direction Y (in FIG. 8) and the direction opposite to the direction Y, and stresses acting in the direction X (in FIG. 8) and the direction opposite to the direction X, the fuse holder engagement projection 41 can withstand these stresses.

As shown in FIG. 9, the connector block engagement reception portion 44 (45) of the power bus bar 16 is in the form of a C-shaped hole, and therefore even when the connector block engagement reception portion undergoes stresses, acting in the direction Y (in FIG. 9) and the direction opposite to the direction Y, and stresses acting in the direction X (in FIG. 9) and the direction opposite to the direction X, this connector block engagement reception portion can withstand these stresses.

As shown in FIG. 10, the fuse holder 12, the printed circuit board 11 and the first and second connector blocks 14 and 15 which are provisionally fixed to one another (see FIG. 5) are attached to the power bus bar 16 in the direction opposite to the direction Z (in FIG. 10). The fuse holder engagement projections 41 and 41 of the power bus bar 16 are engaged respectively with the bus bar fixing reception portions 28 and 28 of the fuse holder 12, and the connector block engagement reception portion 42 is engaged with the bus bar fixing engagement projection 32 of the first connector block 14, and the connector block engagement reception portion 43 is engaged with the bus bar fixing engagement projection 37 of the second connector block 15, and the connector block engagement reception portions 44 and 45 are engaged is respectively with the bus bar fixing engagement projections 33 and 38 of the first and second connector blocks 14 and 15.

As shown in FIG. 11, the power bus bar 16 of high rigidity is attached to the fuse holder 12, the printed circuit board 11 and the first and second connector blocks 14 and 15 (which are provisionally fixed to one another) in a unitary manner by the engagement of the projections with the respective reception portions. Therefore, this assembly has such a high rigidity that the constituent members will not be displaced relative to one another.

Then, screws 46 are threaded relative to the fuse holder 12, the printed circuit board 11 and the first and second connector blocks 14 and 15 (which are provisionally fixed to one another) from the reverse side of the printed circuit board 11, so that the fuse holder 12 and the first and second connector blocks 14 and 15 are completely fixed to the printed circuit board 11. Then, the board connection portions 19, 21, 23 and 40, passing through the respective connection holes 24 in the printed circuit board 11, are soldered. At this time, the board connection portions 19, 21, 23 and 40, passing through the respective connection holes 24, are soldered without being displaced, since the power bus bar 16 is attached to the fuse holder 12, the printed circuit board 11 and the first and second connector blocks 14 and 15 to thereby increase the overall rigidity. Therefore, the joining operation is positively effected without inviting cracks in the soldered portions and other troubles.

The electric distribution block 10 is completely assembled when the above soldering operation is finished, and as shown in FIG. 13, the relays 39 are disposed beneath the printed circuit board 11 in spaced relation thereto (that is, the relays 39 are disposed out of contact with the printed circuit board 11), and also are disposed between the first and second connectors 14 and 15, and the fuse insertion portions 25 and 26 are disposed at the sides of the power bus bar 16 (on which the relays 39 are mounted in a fitted manner) and printed circuit board 11. The fuse plate 13 is attached to the fuse insertion portions 25 and 26. A controller 47 is mounted beneath the power bus bar 16. Therefore, the power bus bar 16 and the controller 47 are disposed in proximity to each other, and therefore a bent portion (not shown), forming a circuit for the controller 47, can be easily formed, and an energizing circuit from the power bus bar 16 to the controller 47 can be formed at the shortest distance. An outer cover 48 is attached to cover the printed circuit board 11, and a controller cover 49 is attached to cover the controller 46.

In the above electric distribution block 10, the fuse holder 12 and the first and second connector blocks 14 and 15 are mounted on the printed circuit board 11, and then the printed circuit board 11 is fixed to the power bus bar 16 having the rigid structure, and then the fuse terminals 17 and power supply terminal 18 of the fuse holder 12 and the connector terminals 20 and 22 of the first and second connector blocks 14 and 15 are soldered at the reverse surface of the printed circuit board 11 to be electrically connected thereto. Therefore, when the printed circuit board 11, having the fuse holder 12 and the first and second connector blocks 14 and 16 mounted thereon, is fixed to the power bus bar 16, there is provided the assembly of high rigidity. Then, the fuse terminals 17 and power supply terminal 18 of the fuse holder 12 and the connector terminals 20 and 22 of the first and second connector blocks 14 and 15 are soldered to the printed circuit board 11, and therefore these terminals are soldered to the assembly of high rigidity, so that the efficiency of the operation is good, and the time and labor, required for the assembling operation, can be reduced. Thus, the assembly has the high rigidity, and therefore the displacement of the parts will not occur during and after the soldering operation, and cracks will not develop in the soldered portions, and therefore the assembling operation can be carried out positively.

Furthermore, in the electric distribution block 10, the connector terminals 20 and 22 of the first and second connector blocks 14 and 15 and the fuse terminals 17 and power supply terminal 18 of the fuse holder 12 are soldered to the printed circuit board 11 to which the first and second connector blocks 14 and 15 and the fuse holder 12 are provisionally fixed, and therefore the displacement of the parts is further prevented.

Furthermore, in the electric distribution block 10, when the power bus bar 16 is fixed to the first and second connector blocks 14 and 15 and the fuse holder 12 which are provisionally fixed to one anther, the first and second connector blocks 14 and 15 and the fuse holder 12 are fixed to the power bus bar 16 by the fixing portion. With this construction, this fixing operation can be carried out, efficiently utilizing the space without the use of any other separate fixing portion.

Furthermore, in the electric distribution block 10, the T-shaped projections are used, and therefore the fuse holder 12 and the first and second connector blocks 14 and 15 can be mounted on the printed circuit board 11 in such a manner that they will not be displaced and shake.

The present invention is not limited to the above embodiment, and suitable modifications, improvements and so on can be made. For example, the number of the fuse terminals, the number of the connector terminals and the number of the bus bars are suitably determined according to the number of circuits provided in a vehicle on which the electric distribution block is to be mounted.

The shape and number of the fixing portion are suitably determined in view of their moldability. Preferably, this shape is the illustrated T-shape.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2004-374698 filed on Dec. 24, 2004, the contents of which are incorporated herein for reference.

What is claimed is:

1. An electric distribution block, comprising:
    a printed circuit board that has a distribution installation circuit;
    a block that has a plurality of terminals and is fixed to the printed circuit board; and
    a power bus bar that has a rigid structure and has a plurality of connection portions for electrically connecting to the printed circuit board,
    wherein both of the printed circuit board and the block, which are fixed to each other, are directly fixed to the power bus bar by structural elements disposed on the power bus bar; and
    wherein the structural elements are independent of the connection portions.

2. The electric distribution block according to claim 1, wherein a plurality of the blocks are a fuse holder and a connector block;
    wherein a plurality of fuse terminals and a power supply terminals are press-fitted in the fuse holder, and a fuse plate arranged in the vicinity of the terminals is attached to the fuse holder; and
    wherein a plurality of connection terminals are press-fitted in the connector block.

3. The electric distribution block according to claim 1, wherein the block is soldered to the printed circuit board that is fixed to the power bus bar.

4. The electric distribution block according to claim 1, wherein the structural elements disposed on the power bus bar are engagement projections which prevent displacement of the block, printed circuit board and bus bar relative to one another.

5. The electric distribution block according to claim 1, wherein the structural elements are connections for maintaining a shape of the electric distribution block.

6. The electric distribution block according to claim 1, wherein the structural element disposed on the power bus bar has a fixing portion; and
    wherein the block is fixed to the power bus bar by the fixing portion.

7. The electric distribution block according to claim 6, wherein the fixing portion is T-shaped projection.

* * * * *